United States Patent [19]

Wada et al.

[11] Patent Number: 5,058,062
[45] Date of Patent: Oct. 15, 1991

[54] NONVOLATILE SEMICONDUCTOR MEMORY CIRCUIT INCLUDING A RELIABLE SENSE AMPLIFIER

[75] Inventors: Yukio Wada; Tadashi Maruyama; Toshimasa Nakamura, all of Yokohama, Japan

[73] Assignee: Kabushiki Kaisha Toshiba, Kawasaki, Japan

[21] Appl. No.: 431,845

[22] Filed: Nov. 6, 1989

[30] Foreign Application Priority Data

Nov. 9, 1988 [JP] Japan ................................ 63-283198

[51] Int. Cl.⁵ ........................ G11C 11/34; G11C 7/02
[52] U.S. Cl. ................................... 365/185; 365/205; 365/208; 365/189.05
[58] Field of Search .................. 365/189.05, 185, 210, 365/205, 207, 208, 189.09

[56] References Cited

U.S. PATENT DOCUMENTS

| | | | |
|---|---|---|---|
| 4,031,524 | 6/1977 | Heeren | 364/104 |
| 4,144,590 | 3/1979 | Kitagawa et al. | 365/205 |
| 4,185,321 | 1/1980 | Iwahashi et al. | 365/204 |
| 4,223,394 | 9/1980 | Pathak et al. | 365/210 |
| 4,270,190 | 5/1981 | Jindra et al. | 365/210 |
| 4,301,518 | 11/1981 | Klaas | 365/185 |
| 4,384,349 | 5/1983 | McElroy | 365/185 |
| 4,404,659 | 9/1983 | Kihara et al. | 365/185 |
| 4,425,632 | 1/1984 | Iwahashi et al. | 365/185 |
| 4,494,219 | 1/1985 | Tanaka et al. | 365/210 |
| 4,677,590 | 6/1987 | Arakawa | 365/210 |
| 4,713,797 | 12/1987 | Morton et al. | 365/185 |
| 4,761,765 | 8/1988 | Hashimoto | 365/210 |
| 4,769,787 | 9/1988 | Furusawa et al. | 365/189.09 |
| 4,799,195 | 1/1989 | Iwahashi et al. | 365/210 |
| 4,819,212 | 4/1989 | Nakai et al. | 365/185 |
| 4,858,194 | 8/1989 | Terada et al. | 365/189.09 |
| 4,930,105 | 5/1990 | Matsumoto et al. | 365/185 |
| 4,972,378 | 11/1990 | Kitagawa et al. | 365/205 |

FOREIGN PATENT DOCUMENTS 175880 4/1986 European Pat. Off. .
199501 10/1986 European Pat. Off. .

OTHER PUBLICATIONS

"A Fast 8K×8 CMOS SRAM with Internal Power Down Design Techniques", Sood et al.; IEEE 1985 Journal of Solid-State Circuits, pp. 941-950.
"Wide Operating Voltage Range and Low Power Consumption EPROM Structure for Consumer Oriented ASIC Applications", Maruyama et al.; IEEE 1988 CICC, pp. 4.1.1-4.1.4.

Primary Examiner—Joseph A. Popek
Assistant Examiner—Michael A. Whitfield
Attorney, Agent, or Firm—Finnegan, Henderson, Farabow, Garrett and Dunner

[57] ABSTRACT

A nonvolatile memory device has a memory cell having its gate connected to a word line, its source connected to a ground potential and its drain connected to a power supply voltage via a bit line and a dummy cell having its gate connected to the word line, its source connected to the source potential and its drain connected to the power supply voltage via a dummy bit line. The bit line and the dummy bit line are connected to reset and set terminals of a sense amplifier circuit comprising a flip-flop circuit and a latch type of sense amplifier. The conductance of the dummy cell is made smaller than that of the memory cell so that the speed at which the potential on the bit line is lowered depends on the state of injection of electrons into the memory cell as compared with the speed at which the potential on the dummy bit line at a time of reading data. The flip-flop circuit is reset or set in accordance with the speed at which the potential on the bit line is lowered and then the latch type of sense amplifier operates to latch the output of the flip-flop circuit and output it as read data.

17 Claims, 7 Drawing Sheets

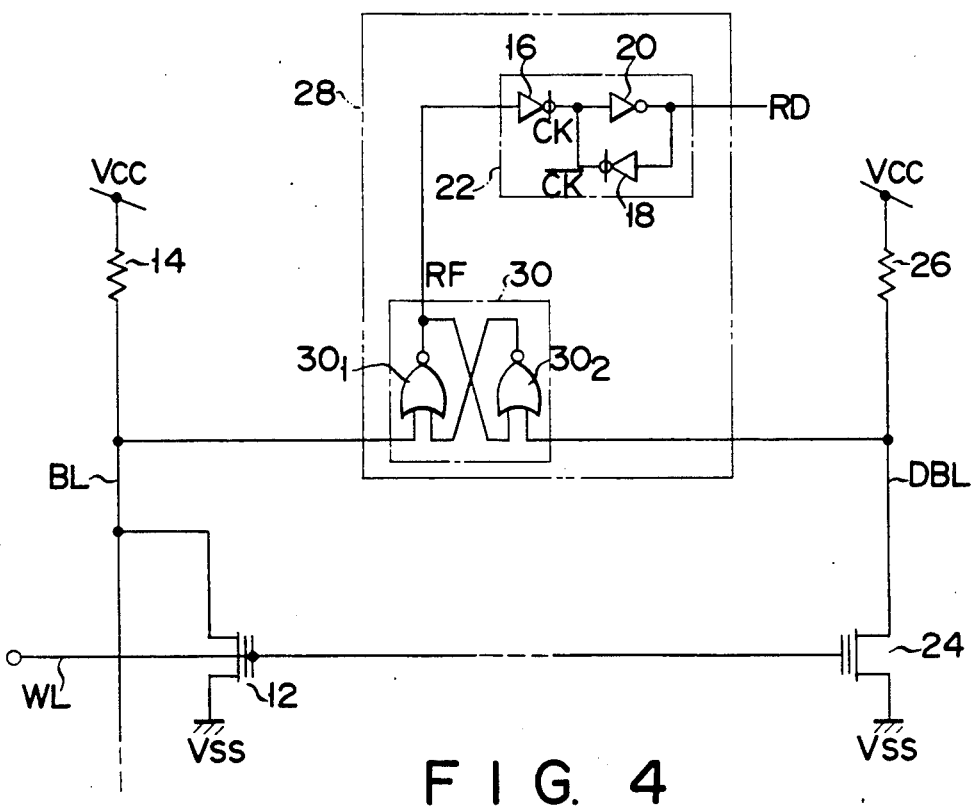
F I G. 4

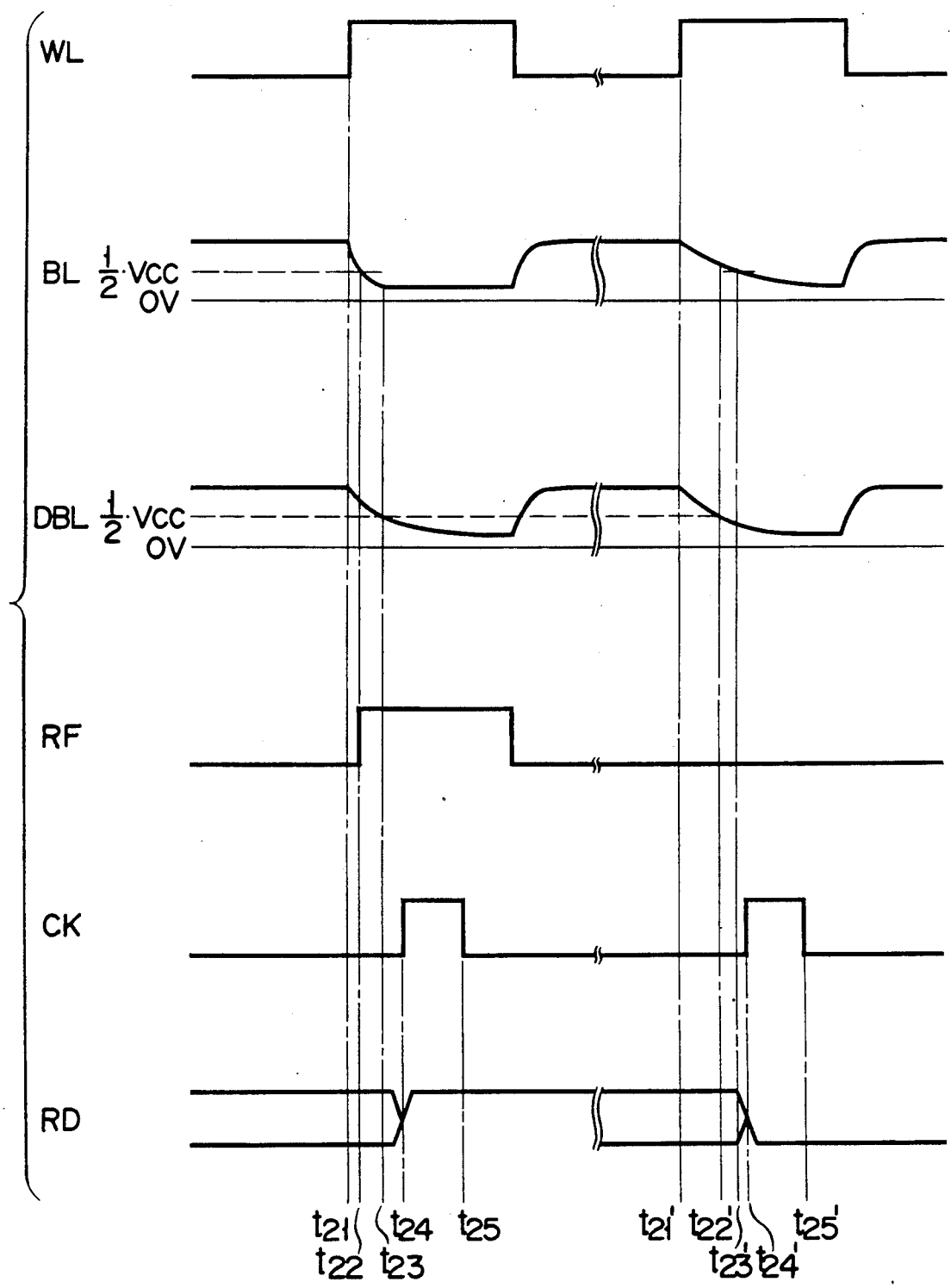
F I G. 5

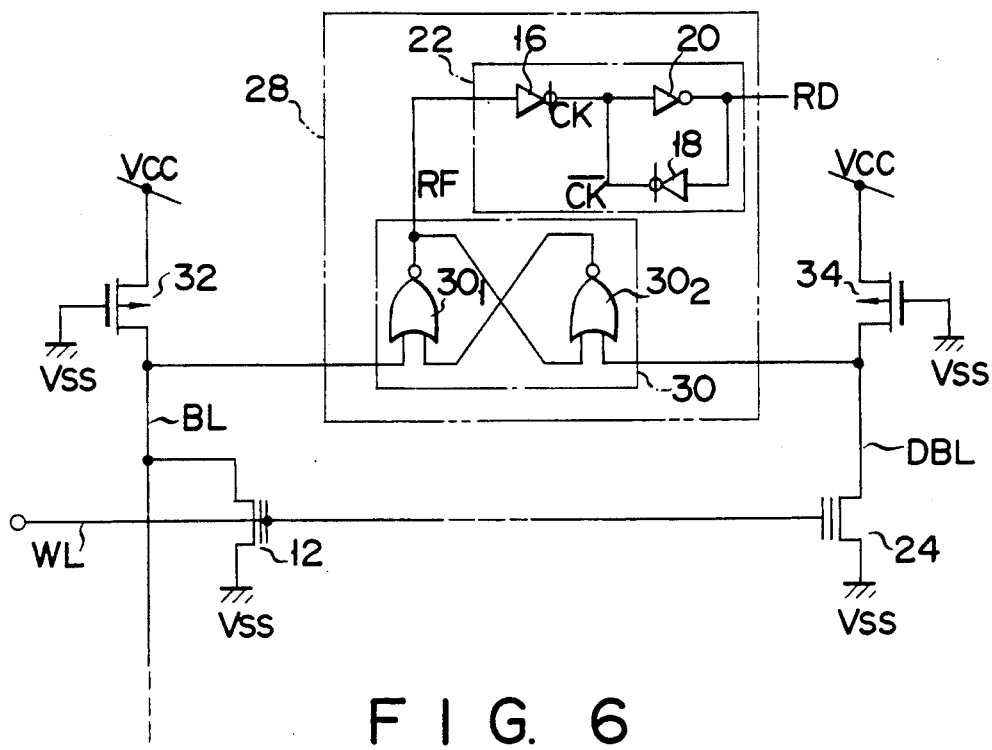
F I G. 6
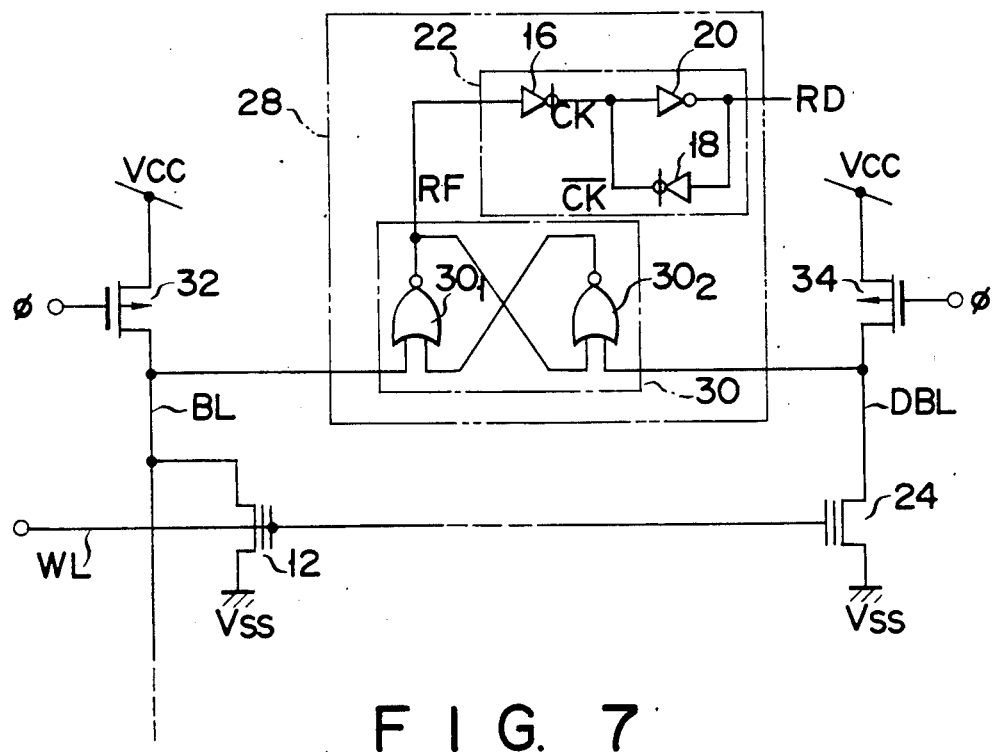
F I G. 7

NONVOLATILE SEMICONDUCTOR MEMORY CIRCUIT INCLUDING A RELIABLE SENSE AMPLIFIER

BACKGROUND OF THE INVENTION

1. Field of the Invention

The present invention relates to a nonvolatile memory which can write and erase data and, more particularly, to a nonvolatile memory from which data can be read at proper time.

2. Description of the Related Art

In general, in erasable programmable read only memories (EPROMs), data is stored in the form of presence or absence of electric charges at floating gates of nonvolatile transistors serving as memory cells. The erasure of data which has been written is performed by irradiation with ultraviolet rays and data can be written into again.

FIG. 1 illustrates a circuit arrangement for reading out data in a prior art EPROM. In the Figure, reference numeral 12 designates a memory cell formed of a nonvolatile transistor with a floating gate. Memory cell 12 has its gate connected to a word line WL, its source connected to ground potential Vss and its drain connected to a bit line BL via a selecting transistor (not shown). Bit line BL is connected to power supply voltage Vcc via a load 14. Bit line BL is connected to a latch type of sense amplifier circuit 22 comprised of two clocked inverters 16 and 18 and an inverter 20 for providing read data RD.

In FIG. 2 there is illustrated a timing chart of the above prior-art EPROM. It is assumed here that memory cell 12 is programmed with data beforehand.

To read data, word line WL is selected first. If electrons are not injected into the floating gate at the programming time and thus the threshold voltage is low, memory cell 12 is turned on (time $t_1$) so that bit line BL is discharged through cell 12. Hence, the potential of bit line BL is lowered gradually down to a "LOW" level. On the other hand, if electrons are injected into the floating gate at the programming time and thus the threshold voltage is rendered high, memory cell 12 is not turned on. Thus, bit line BL is charged through load 14 up to a "HIGH" level.

When clock signal CK goes to a "HIGH" level (time $t_2$), clocked inverter 16 is brought into operation to take in data appearing on bit line BL. Next, when clock signal CK goes to a "LOW" level (time $t_3$), a positive feedback circuit formed of clocked inverter 18 and inverter 20 operates to latch the data taken in by clocked inverter 16. The data is output as readout data RD.

When a memory cell whose floating gate has been injected with electrons is selected as described above, the memory cell cannot hold the completely off state in practice. For this reason, a little current flows between the drain and source so that bit line BL is discharged gradually. Thus, the potential of bit line BL is lowered as shown in FIG. 3. After the lapse of a constant time t (time $t_{13}$) from when the potential of word line WL goes to "HIGH" level (time $t_{11}$), the potential of bit line BL will become lower than $\frac{1}{2}$Vcc, and $\frac{1}{2}$Vcc is the threshold voltage of clocked inverter 16.

It is assumed that clock signal CK remains at the "HIGH" level (at time $t_{12}$) even after the lapse of constant time t (at time $t_{13}$) from the time when clock CK was raised to "HIGH" level. Then, the output of clocked inverter 16, which should be at a "LOW" level, will be inverted to "HIGH" level. Hence, sense amplifier 22 will latch erroneous data.

In order to prevent sense amplifier 22 from latching erroneous data, the clock signal CK needs to be lowered to "LOW" level before the potential of bit line BL goes lower than $\frac{1}{2}$Vcc. However, the time at which the potential of bit line BL goes lower than $\frac{1}{2}$Vcc will vary with power supply voltage Vcc and the characteristics of individual memory cells. Moreover, the time need for the potential to drop will be affected by variations in the threshold voltage of a memory cell over time. With a conventional EPROM, therefore, even if it operates properly right after manufacture, the possibility of malfunction will increase with time.

With conventional nonvolatile memory devices, as described above, the time at which the latch type of sense amplifier latches data appearing on a bit line is determined at the circuit design stage. The difficulty with conventional nonvolatile memories is that, even if they operate properly at first, the possibility of malfunction increases with time.

SUMMARY OF THE INVENTION

It is accordingly an object of the present invention to provide a nonvolatile memory device capable of outputting correct read data always at proper time.

According to an aspect of the present invention, there is provided a nonvolatile memory device comprising: a first data read line having an end connected to a first power supply for providing a first predetermined power supply voltage; first nonvolatile semiconductor means having a current path and a control electrode, an end of the current path being connected to the first data read line and the other end of the current path being connected to a second power supply for providing a second predetermined power supply voltage; a second data read line having an end connected to the first power supply; second nonvolatile semiconductor means having a current path and a control electrode, an end of the current path being connected to the second data read line and the other end of the current path being connected to the second power supply; a word line connected to the control electrodes of the first and second nonvolatile semiconductor means; and sense amplifier circuit means having first an second input sections connected to the first and second nonvolatile semiconductor means and an output section for outputting read data from the output section at a predetermined time in accordance with potentials on the first and second read lines applied to the first and second input sections.

According to another aspect of the present invention, there is provided a nonvolatile memory device comprising a first data read line having an end connected to a first power supply for providing a first predetermined power supply voltage; first nonvolatile semiconductor means having a current path and a control electrode, an end of the current path being connected to the first data read line and the other end of the current path being connected to a predetermined write line; a second data read line having an end connected to the first power supply; second nonvolatile semiconductor means having a current path and a control electrode, an end of the current path being connected to the second data read line and the other end of the current path being connected to a second power supply for providing a second predetermined power supply voltage; a word line connected to the control electrodes of the first and second nonvolatile semiconductor means; and sense amplifier circuit means having first and second input sections connected to the first and second nonvolatile semiconductor means and an output section for outputting read data from the output section at a predetermined time in accordance with potentials on the first and second read lines applied to the first and second input sections; wherein the write line is set to the same potential as a potential provided by the second power supply at a time of reading data and set to a high potential at a time of writing data.

BRIEF DESCRIPTION OF THE DRAWINGS

These and other features and advantages of the present invention will become apparent from the following detailed description of exemplary embodiments as illustrated in the accompanying drawings in which:

FIG. 4 is a circuit diagram of a nonvolatile memory device according to an embodiment of the present invention;

FIG. 5 is a timing diagram which is useful in understanding the operation of the circuit of FIG. 4;

FIG. 6 is a circuit diagram of a nonvolatile memory device according to a second embodiment of the present invention;

FIG. 7 is a circuit diagram of a nonvolatile memory device according to a third embodiment of the present invention;

DETAILED DESCRIPTION OF THE PREFERRED EMBODIMENTS

Figure 1:
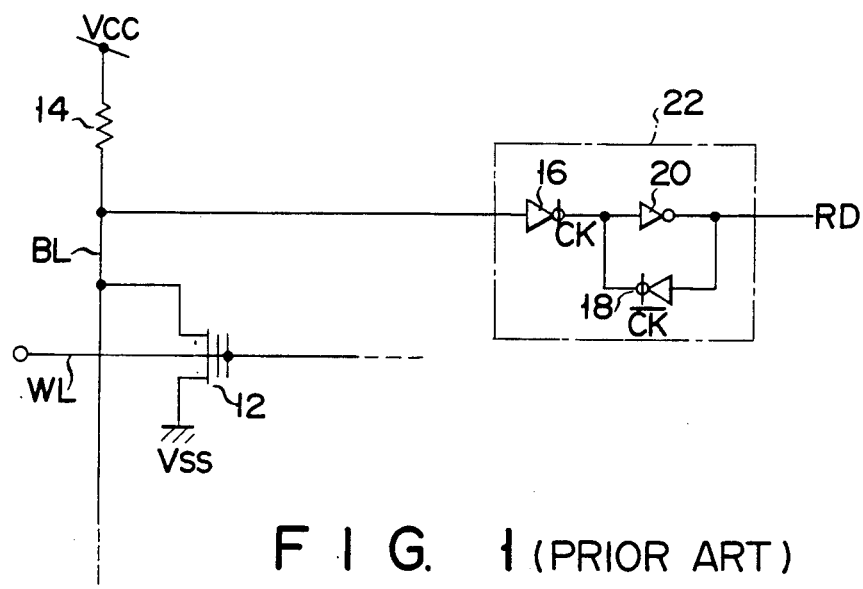
FIG. 1 is a circuit diagram of part of a prior art nonvolatile memory device.
Figure 2:
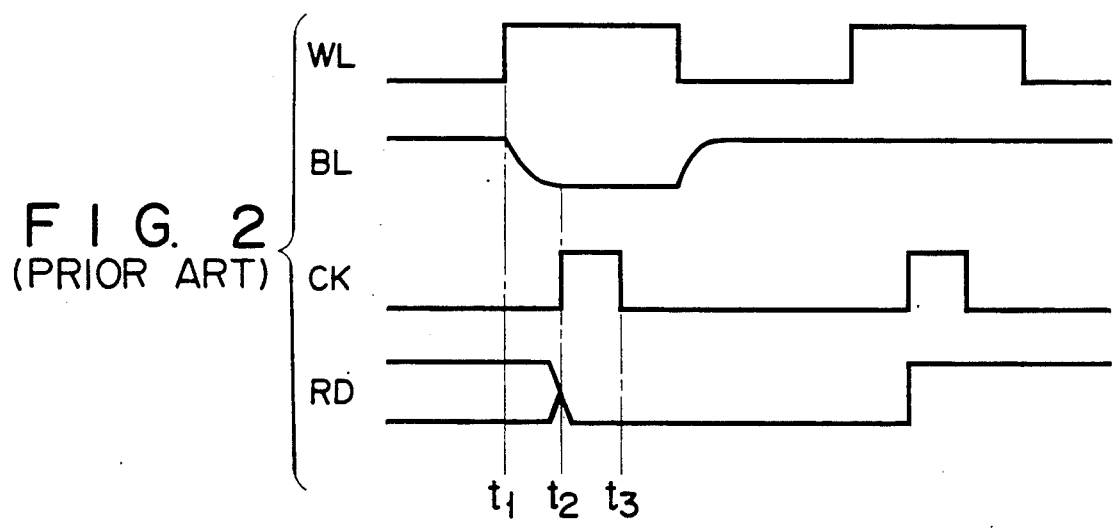
FIGS. 2 and 3 are timing diagrams which are useful in understanding the operation of the prior art circuit of FIG. 1.
Figure 3:
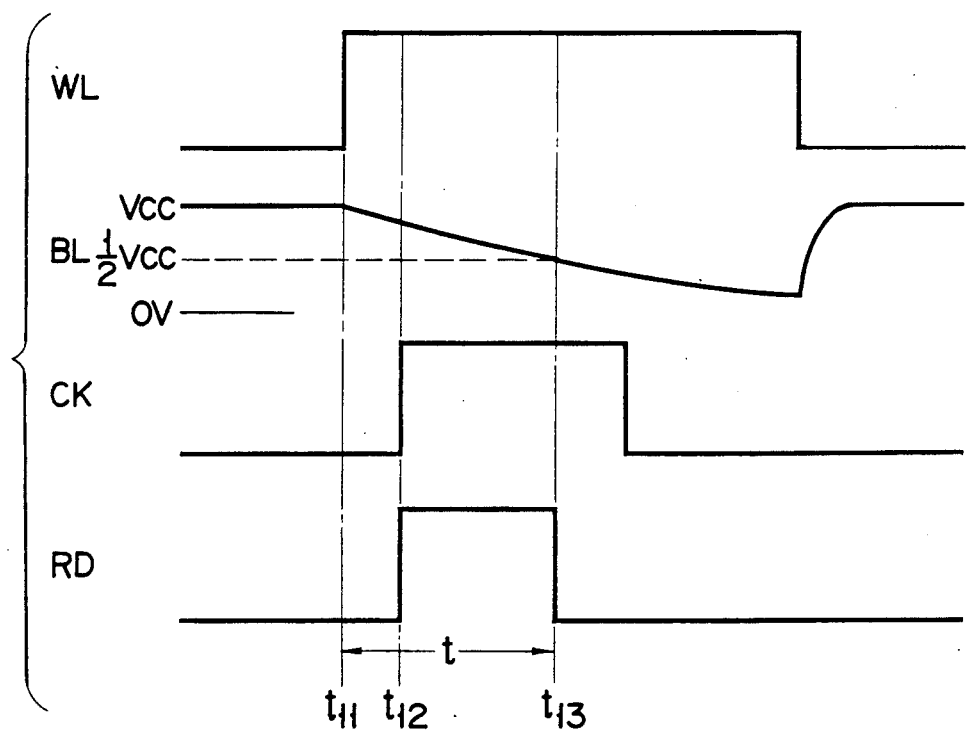

The preferred embodiments of the present invention will be described below with reference to accompanying drawings. Like reference characters are used to designate corresponding parts to those in the prior art circuit of FIG. 1 and descriptions thereof will be omitted.

FIG. 4 is a schematic diagram of a circuit adapted for data readout in a case where a nonvolatile memory device of the present invention is applied to an EPROM using nonvolatile transistors with floating gates as memory cells.

In FIG. 4, one memory cell 12 is formed of a floating gate type of nonvolatile transistor. The memory cell 12 has its gate connected to a word line WL, its source connected to ground potential Vss and its drain connected to a bit line BL via a selecting transistor (not shown). The bit line BL is connected to power supply voltage Vcc via a load resistor 14. Reference numeral 24 designates a dummy cell which is formed of a floating gate type of nonvolatile transistor like memory cell 12. The dummy cell 24 has its gate connected to word line WL, its source connected to ground potential Vss and its drain connected to a dummy bit line DBL. The dummy bit line DBL is connected to power supply voltage Vcc via a load resistor 26. It is to be noted that electrons are selectively injected into the floating gate of memory cell 12 at a programming time, while the floating gate of dummy cell 24 is not injected with electrons, and thus the dummy cell's 24 threshold voltage is always set low.

Dummy cell 24 is designed such that its dimension, e.g., the channel width, is smaller than that of memory cell 12. Also, the conductance of dummy cell 24 is set smaller than, for example, about half that of memory cell 12. The bit line BL and dummy bit line DBL are designed such that they are equivalent to each other in parasitic capacitance associated therewith.

Sense amplifier 28 is formed of a flip-flop circuit 30 and a latch circuit 22. Flip-flop circuit 30 is comprised of cross-coupled NOR gates $30_1$ and $30_2$. NOR gate $30_1$ has its first input terminal serving as a reset terminal connected to bit line BL. NOR gate $30_2$ has its first input terminal serving as a set terminal connected to dummy bit line DBL. The outputs of NOR gates $30_1$ and $30_2$ are connected to the second input terminals of NOR gates $30_2$ and $30_1$, respectively. The output RF of flip-flop circuit 30 is applied to the latch circuit 22, which is comprised of two clocked inverters 16 and 18 and an inverter 20, to provide read data RD.

For explaining the operation of the memory, reference will be made to a timing diagram illustrated in FIG. 5.

Before data is read out, word line WL is set at a "LOW" level in potential so that memory cell 12 and dummy cell 24 are in the off state. Bit line BL and dummy bit line DBL are set at a "HIGH" level through power supply voltage Vcc. At this point the output RF of NOR gate $30_1$ in flip-flop circuit 30 is set at "LOW" level. Next, when the potential of word line WL goes to "HIGH" level, memory cell 12 operates as follows according to its stored content.

If the floating gate of selected memory cell 12 has not been injected with electrons, its threshold voltage is low. When word line WL is raised to "HIGH" level (time $t_{21}$), memory cell 12 is turned on so that the potential of bit line BL goes to "LOW" level. On the other hand, the floating gate of dummy cell 24 is also not injected with electrons so that the dummy cell's 24 threshold voltage is low. Hence, dummy cell 24 is also turned on so that the potential of dummy bit line DBL also goes to "LOW" level.

As described above, the conductance of dummy cell 24 is made smaller than that of memory cell 12. Thus, the speed at which the potential of dummy bit line DBL is lowered to the "LOW" level is slower than that at which the potential of bit line BL is lowered to the "LOW" level. Hence, the potential of bit line BL will first arrive at ½Vcc, the circuit threshold voltage of NOR gate $30_1$ of flip-flop circuit 30 (time $t_{22}$). As a result, flip-flop circuit 30 is set so that its output RF goes to "HIGH" level. Even if the potential of dummy bit line DBL arrives at ½Vcc after flip-flop circuit 30 is set, the state of flip-flop circuit 30 does not change because NOR gate $30_2$ is supplied with the signal RF at "HIGH" level at the time of resetting. After flip-flop circuit 30 has been set, therefore, the signal RF can be loaded into the latch circuit 22 by raising clock signal CK to "HIGH" level at a predetermined time (time $t_{24}$)

Afterwards, clock signal CK goes to "LOW" level (time $t_{25}$) and sense amplifier 22 performs latch operation so that "HIGH" level data is output as read data RD.

On the other hand, where the floating gate of selected memory cell 12 has been injected with electrons, the threshold voltage is high. Thus memory cell 12 is not turned on. However, as described above, the potential of bit line BL is gradually lowered from "HIGH" level to "LOW" level during a period of time in which the potential of word line WL is at "HIGH" level (for example, from time $t_{21}'$). Dummy cell 24 is in the on-state during this period so that the potential of dummy bit line DBL is also lowered to "LOW" level.

The conductance of dummy cell 24 is made larger than that of memory cell 12 which is in the off-state. Thus, the speed at which the potential of dummy bit line DBL is lowered to the "LOW" level is faster than that at which the potential of bit line BL is lowered to the "LOW" level. Hence, the potential of dummy bit line DBL will first arrive at $\frac{1}{2}$Vcc, the circuit threshold voltage of NOR gate $30_2$ of flip-flop circuit 30 (time $t_{22}'$). As a result, flip-flop circuit, 30 is reset so that its output RF remains "LOW" level. Even if the potential of bit line BL arrives at $\frac{1}{2}$Vcc (time $t_{23}'$) after flip-flop circuit 30 is reset, the state of flip-flop circuit 30 does not change because NOR gate $30_1$ is supplied with the output of NOR gate $30_2$ that was rendered high at the time of setting. After flip-flop circuit 30 has been reset, therefore, the output signal RF of flip-flop circuit 30 can be loaded into the latch circuit 22 by raising clock signal CK to "HIGH" level at a predetermined time (time $t_{24}'$). Afterwards, clock signal CK goes to "LOW" level (time $t_{25}'$) and latch circuit 22 remains "LOW" level data as a read data RD.

According to such a nonvolatile memory device as constructed above, the malfunction of a sense amplifier circuit can be prevented in reading data from a memory cell whose floating gate is injected with electrons.

FIG. 6 is a circuit diagram of a nonvolatile memory device according to a second embodiment of the present invention. In this embodiment, load resistors 14 and 26 connected respectively to bit line BL and dummy bit line DBL in the first embodiment of FIG. 4 are replaced with P-channel transistors 32 and 34. These transistors 32 and 34 are connected at their gates to ground potential Vss so that they are normally on. Other elements than those transistors are identical to those in the first embodiment (FIG. 4) and descriptions thereof are, thus, omitted.

Figure 8:
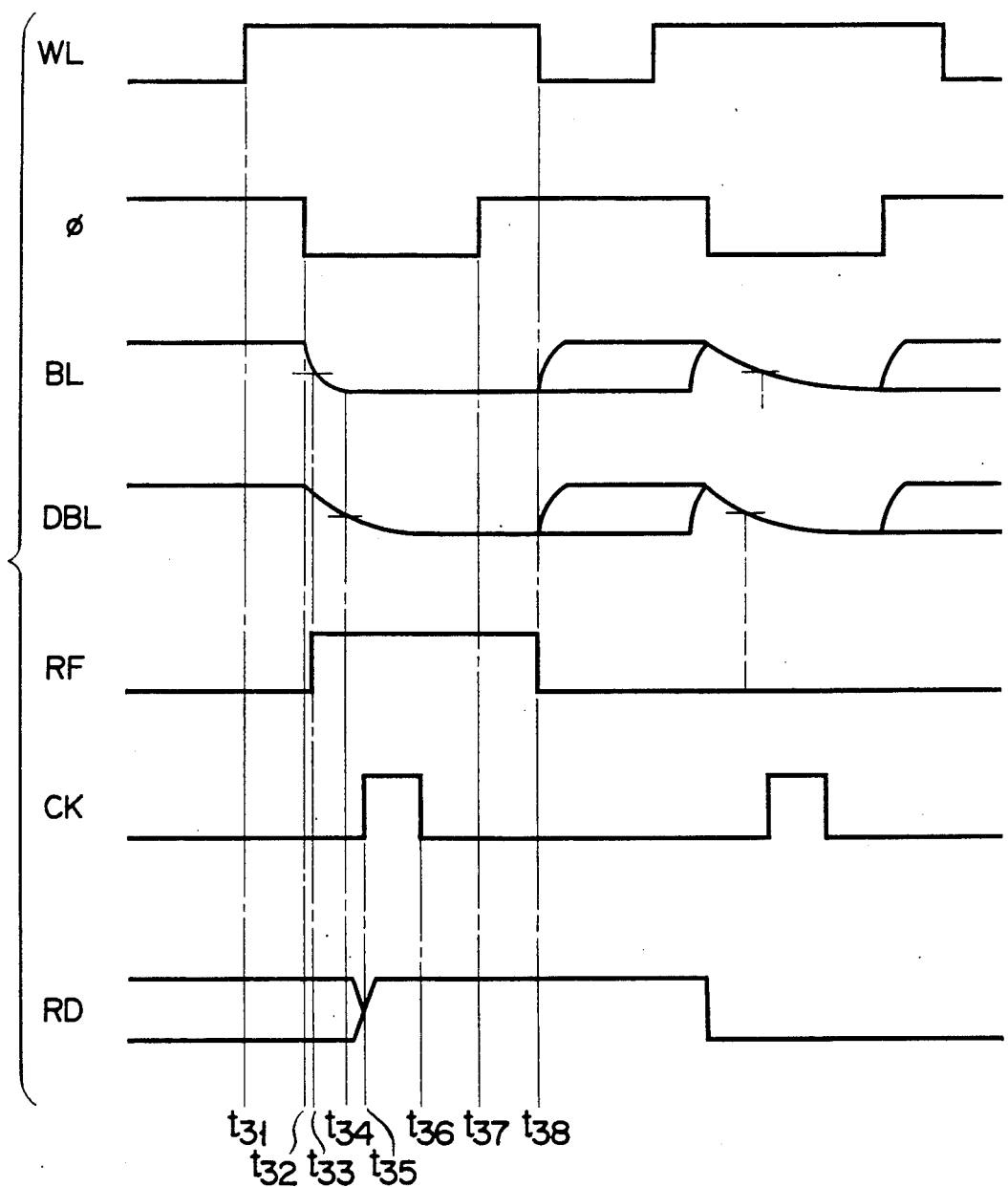
FIG. 8 is a timing diagram which is useful in understanding the operation of the circuit of FIG. 7.

FIG. 7 illustrates a third embodiment of the nonvolatile memory device according to the present invention, in which P-channel load transistors 32 and 34 have their gates connected to receive a pulse signal $\phi$ which is timed as shown in FIG. 8, unlike the embodiment of FIG. 6 in which the gates of transistors 32 and 34 are connected to ground potential Vss. The third embodiment is the same as the first and second embodiments except for pulse signal $\phi$ applied to transistors 32 and 34. The detailed description of the arrangement and operation of the third embodiment are, thus, omitted.

The pulse signal $\phi$ is held at a "LOW" level for a predetermined period of time (from $t_{32}$ to $t_{37}$) within a time interval in which word line WL is at a "HIGH" level (from $t_{31}$ to $t_{38}$) Hence, the period of time during which current flows out of a point at which power supply voltage Vcc is applied can be shortened as compared with the first and second embodiments in which load resistors 14 and 26 and normally-on P-channel MOS transistors 32 and 34 are used, thereby attaining low power dissipation. Note that times $t_{33}$, $t_{34}$, $t_{35}$ and $t_{36}$ in the timing diagram of FIG. 8 correspond to $t_{22}$, $t_{23}$, $t_{24}$ and $t_{25}$ in the timing diagram of FIG. 5, respectively. The descriptions thereof are thus omitted.

Figure 9:
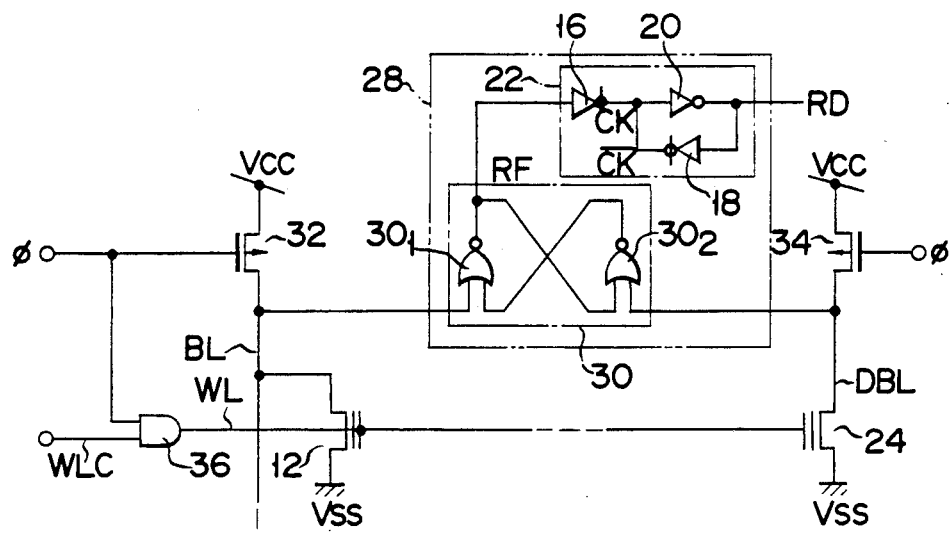
FIG. 9 is a circuit diagram of a nonvolatile memory device according to a fourth embodiment of the present invention.

FIG. 9 shows a fourth embodiment of the nonvolatile memory device of the present invention in which the pulse signal $\phi$ applied to the gates of load transistors 32 and 34 in the third embodiment of FIG. 7 and a control signal on a corresponding word-line control line WLC are applied to a two-input AND gate the output of which is coupled to a word line WL. In this arrangement the fourth embodiment is different from the first and second embodiments.

Figure 10:
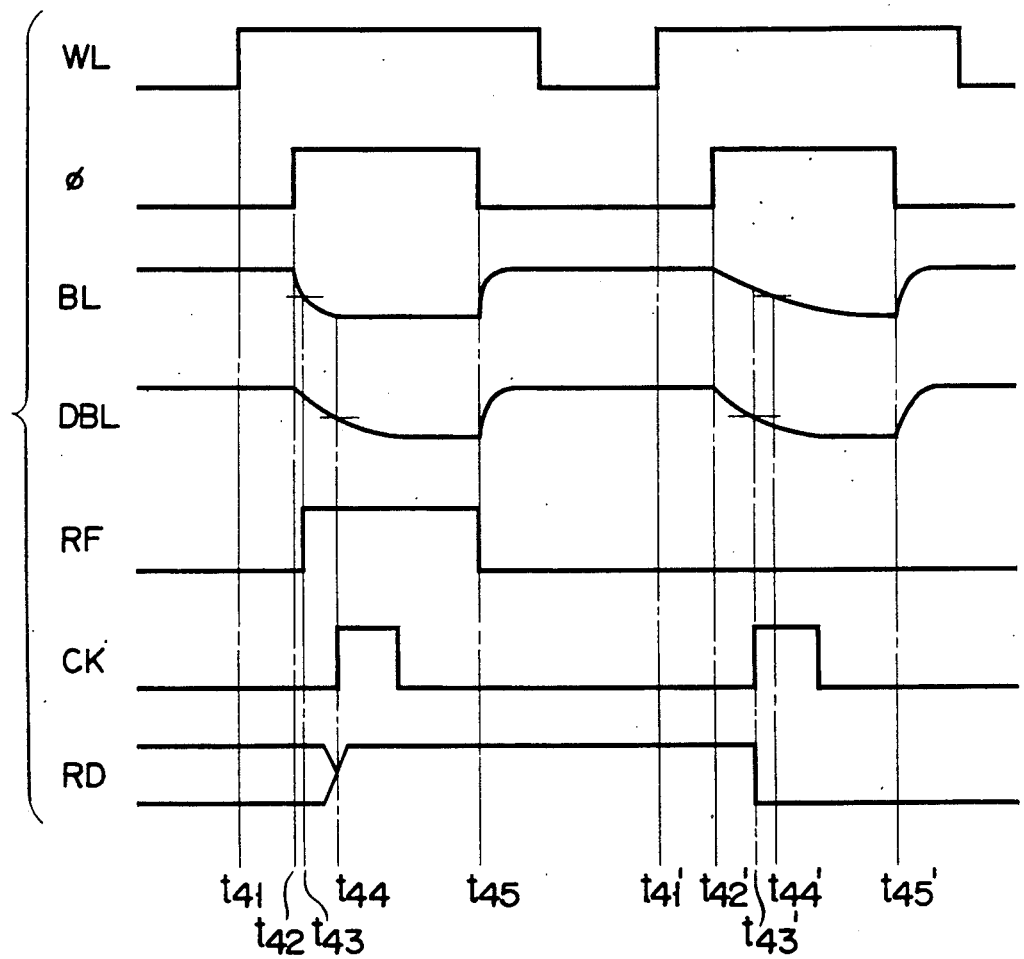
FIG. 10 is a timing diagram which is useful in understanding the operation of the circuit of FIG. 9.

The gates of transistors 32 and 34 are supplied with a pulse signal $\phi$ timed as shown in a timing chart of FIG. 10. A period in which pulse signal $\phi$ is at a "LOW" level, i.e., $\phi=0$V is a precharge period in which MOS transistors 32 and 34 are turned on so that bit line BL and dummy bit line DBL are precharged to a "HIGH" level, for example, five volts. At this point, the output of AND gate 36 is at a "LOW" level, i.e., 0 volts. Hence, when word line WL goes to a "HIGH" level at a time of readout (time $t_{41}$ or $t_{41}'$), one of data-reading paths, which extends from Vcc through bit line BL to the drain-to-source path of the memory cell, is disabled and the other data-reading path, which extends from Vcc through dummy bit line DBL to the drain-to-source path of the dummy memory cell, is also disabled. As illustrated in the timing diagram of FIG. 10, when signal $\phi$ goes to a "HIGH" level, for example, five volts (time $t_{42}$ or $t_{42}'$), MOS transistors 32 and 34 are turned off. At this point, the output signal of AND gate 36 is at five volts so that dummy cell 12 is turned on and thus the potential on dummy bit line DBL is lowered.

When memory cell 12 is not injected with electrons, the potential on bit line BL is lowered faster than that on dummy bit line DBL (times $t_{43}$ and $t_{44}$) On the other hand, if memory cell 12 is injected with electrons, then the potential on bit line BL is lowered gradually and the potential on dummy bit line DBL is lowered faster (times $t_{43}'$ and $t_{44}'$). As a result, flip-flop circuit 30 of sense amplifier 28 is reset or set. Clock signal CK is raised to a "HIGH" level at a predetermined time (time $t_{44}$ or $t_{43}'$) to load output signal RF of flip-flop circuit 30 into the latch circuit 22. Afterwards, clock signal CK goes to a "LOW" level (time $t_{45}$ or $t_{45}'$), causing sense amplifier to provide, as read data RD, data at a "HIGH" or "LOW" level. With such a memory device, power dissipation can be further decreased as compared with the third embodiment.

Figure 11:
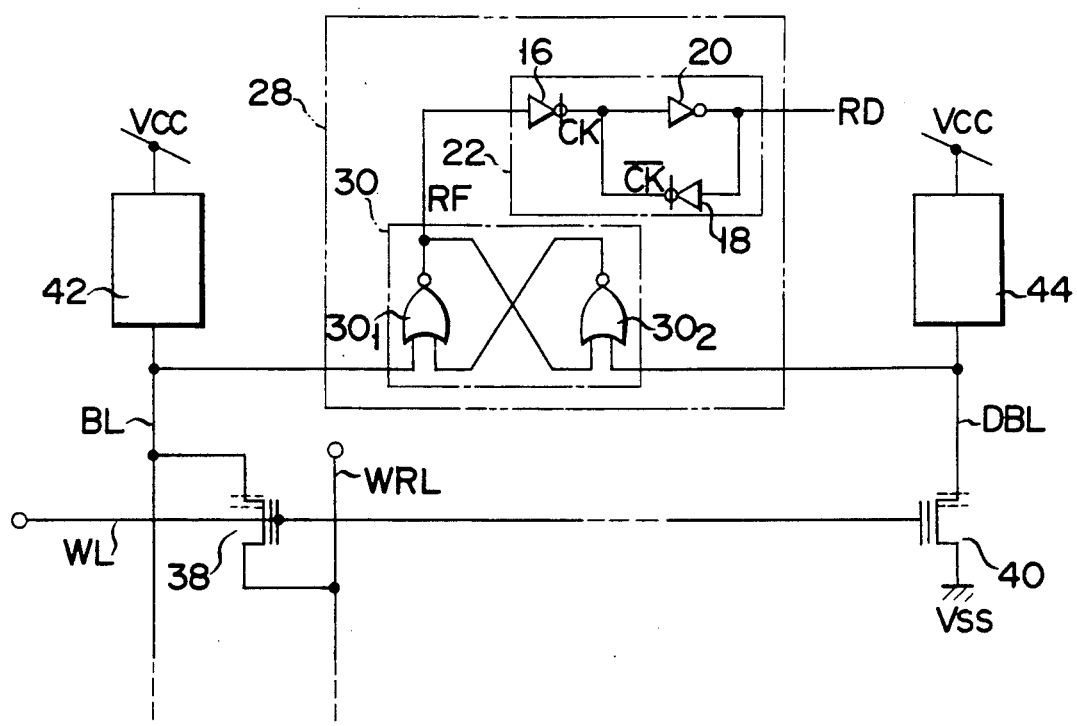
FIG. 11 is a circuit diagram of a nonvolatile memory device according to a fifth embodiment of the present invention.

FIG. 11 illustrates a fifth embodiment of the nonvolatile memory device of the present invention. In this embodiment, instead of memory cell 12 and dummy cell 24 used in the first to fourth embodiments, a memory cell 38 and a dummy cell 40 each of LDD (light-doped drain) structure are used. The source of memory cell 38 is connected to a write line WRL instead of being connected to ground potential. In addition, in the fifth embodiment, load elements 42 and 44 are used in place of load resistors 14 and 26 in the first embodiment or transistors 32 and 34 in the second to fourth embodiments. Other elements are the same as those of the first to fourth embodiments and descriptions thereof are omitted.

In the fifth embodiment, the reason for the use of a LDD type of memory cell is to avoid the occurrence of the so-called soft write phenomenon. It is to be noted that write line WRL is set to ground potential Vss at a time of reading data and to a high potential at a time of writing data.

According to the present invention, as described above, it is possible to read correct data always.

What is claimed is:

1. A nonvolatile memory device comprising:
a first data read line having an end connected to a first power supply for providing a first predetermined power supply voltage;
a first nonvolatile semiconductor memory cell having a current path and a control electrode, an end of said current path being connected to said first data read line and the other end of said current path being connected to a second power supply for providing a second predetermined power supply voltage;
a second data read line having an end connected to said first power supply;
a second nonvolatile semiconductor memory cell having a current path and a control electrode, an end of said current path being connected to said second data read line and the other end of said current path being connected to said second power supply;
a word line connected to said control electrodes of said first and second nonvolatile semiconductor memory cells; and
sense amplifier circuit means having first and second input sections connected to said first and second nonvolatile semiconductor memory cells and an output section for outputting read data from said output section at a predetermined time in accordance with the relative timing of the potentials on said first and second read lines applied to said first and second input sections.

2. A device according to claim 1, in which said sense amplifier circuit means comprises flip-flop circuit means for outputting output data at a time according to the potentials on said first and second read lines applied to said first and second input sections and latch circuit means for latching the output data of said flip-flop circuit means for a predetermined time and then outputting it as the read data.

3. A nonvolatile memory device comprising:
a first data read line having an end connected to a first power supply for providing a first predetermined power supply voltage;
a first nonvolatile semiconductor memory cell having a current path and a control electrode, an end of said current path being connected to said first data read line and the other end of said current path being connected to a second power supply for providing a second predetermined power supply voltage;
a second data read line having an end connected to said first power supply;
a second nonvolatile semiconductor memory cell having a current path and a control electrode, an end of said current path being connected to said second data read line and the other end of said current path being connected to said second power supply;
a word line connected to said control electrodes of said first and second nonvolatile semiconductor memory cells; and
sense amplifier circuit means having first and second input sections connected to said first and second nonvolatile semiconductor memory cells and an output section for outputting read data from said output section at a predetermined time in accordance with potentials on said first and second read lines applied to said first and second input sections, said sense amplifier circuit means comprising a flip-flop circuit means for outputting output data at a time according to the potentials on said first and second read lines applied to said first and second input sections and latch circuit means for latching the output data of said flip-flop circuit means for a predetermined time and then outputting it as the read data, said flip-flop circuit means using said first and second input sections as reset and set terminals, respectively.

4. A device according to claim 3, in which said first nonvolatile semiconductor means has a larger conductance than said second nonvolatile semiconductor means.

5. A device according to claim 4, in which said flip-flop circuit means is set when the potential on said first read line applied to said input section arrives at a circuit threshold voltage faster than the potential on said second read line and is reset when the potential on said second read line applied to said second input section arrives at the circuit threshold voltage faster than the potential on said first read line.

6. A device according to claim 5, further comprising a first load semiconductor element having its current path connected between said first power supply and said first data read line and its control electrode connected to said second power supply and a second load semiconductor element having its current path connected between said first power supply and said second data read line and its control electrode connected to said second power supply.

7. A device according to claim 6, in which said first and second load semiconductor elements are P-channel MOS transistors.

8. A device according to claim 5, further comprising a first load semiconductor element having its current path connected between said first power supply and said first data read line and its control electrode connected to receive a predetermined clock signal and a second load semiconductor element having its current path connected between said first power supply and said second data read line and its control electrode connected to receive a predetermined pulse signal.

9. A device according to claim 8, in which the pulse signals are applied to said control electrodes of said first and second load semiconductor elements only when said word line is at a high potential.

10. A device according to claim 5, further comprising a first load semiconductor element having its current path connected between said first power supply and said first data read line and its control electrode connected to receive a predetermined pulse signal, a second load semiconductor element having its current path connected between said first power supply and said second data read line and its control electrode connected to receive a predetermined pulse signal and AND circuit means having its first input terminal connected to said control electrode of said first load semiconductor element, its second input terminal connected to a word-line control line adapted to control said word line and its output terminal connected to said word line.

11. A device according to claim 10, in which the pulse signals are applied to said control electrodes of said first and second load semiconductor elements only when said word-line control line is at a high potential.

12. A nonvolatile memory device comprising:
a first data read line having an end connected to a first power supply for providing a first predetermined power supply voltage;
a first nonvolatile semiconductor memory cell having a current path and a control electrode, an end of said current path being connected to said first data read line and the other end of said current path being connected to a predetermined write line;
a second data read line having an end connected to said first power supply;
a second nonvolatile semiconductor memory cell having a current path and a control electrode, an end of said current path being connected to said second data read line and the other end of said current path being connected to said second power supply for providing a second predetermined power supply voltage;
a word line connected to said control electrodes of said first and second nonvolatile semiconductor memory cells; and
sense amplifier circuit means having first and second input sections connected to said first and second nonvolatile semiconductor memory cells and an output section for outputting read data from said output section at a predetermined time in accordance with potentials on said first and second read lines applied to said first and second input sections;
wherein said write line is set to a potential equal to a potential provided by said second power supply at a time of reading data and set to a high potential at a time of writing data.

13. A device according to claim 12, in which said first and second nonvolatile semiconductor memory cells have a light-doped drain structure.

14. A device according to claim 13, in which said sense amplifier circuit means comprises flip-flop circuit means for outputting output data at a time according to the potentials on said first and second read lines applied to said first and second input sections and latch circuit means for latching the output data of said flip-flop circuit means for a predetermined time and then outputting it as the read data.

15. A nonvolatile memory device comprising:
a first data read line having an end connected to a first power supply for providing a first predetermined power supply voltage;
a first nonvolatile semiconductor memory cell having a current path and a control electrode, an end of said current path being connected to said first data read line and the other end of said current path being connected to a predetermined write line;
a second data read line having an end connected to said first power supply;
a second nonvolatile semiconductor memory cell having a current path and a control electrode, an end of said current path being connected to said second data read line and the other end of said current path being connected to said second power supply for providing a second predetermined power supply voltage;
a word line connected to said control electrodes of said first and second nonvolatile semiconductor memory cells; and
sense amplifier circuit means having first and second input sections connected to said first and second nonvolatile semiconductor memory cells and an output section for outputting read data from said output section at a predetermined time in accordance with potentials on said first and second read lines applied to said first and second input sections, said sense amplifier circuit means comprising flip-flop circuit means for outputting output data at a time according to the potentials on said first and second read lines applied to said first and second input sections and latch circuit means for latching the output data of said flip-flop circuit means for a predetermined time and then outputting it as the read data, said flip-flop circuit means using said first and second input sections as reset and set terminals, respectively;
wherein said write line is set to the same potential as a potential provided by said second power supply at a time of reading data and set to a high potential at a time of writing data, and said first and second nonvolatile semiconductor memory cells having a lightly-doped drain structure.

16. A device according to claim 15, in which said first nonvolatile semiconductor memory cell has a larger conductance than said second nonvolatile semiconductor memory cell.

17. A device according to claim 16, in which said flip-flop circuit means is set when the potential on said first read line applied to said input section arrives at a circuit threshold voltage faster than the potential on said second read line and is reset when the potential on said second read line applied to said second input section arrives at the circuit threshold voltage faster than the potential on said first read line.

* * * * *